(12) United States Patent
Xie et al.

(10) Patent No.: US 9,685,621 B2
(45) Date of Patent: Jun. 20, 2017

(54) THIN FILM TRANSISTOR, ITS MANUFACTURING METHOD, ARRAY SUBSTRATE AND DISPLAY DEVICE

(71) Applicant: BOE TECHNOLOGY GROUP CO., LTD., Beijing (CN)

(72) Inventors: Yingtao Xie, Bejing (CN); Shihong Ouyang, Beijing (CN); Shucheng Cai, Beijing (CN); Qiang Shi, Beijing (CN); Ze Liu, Beijing (CN); Honhang Fong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/801,309

(22) Filed: Jul. 16, 2015

(65) Prior Publication Data
US 2016/0172608 A1  Jun. 16, 2016

(30) Foreign Application Priority Data

Dec. 16, 2014 (CN) .......................... 2014 1 0784031

(51) Int. Cl.
*H01L 21/00* (2006.01)
*H01L 51/05* (2006.01)
*H01L 51/00* (2006.01)

(52) U.S. Cl.
CPC ...... *H01L 51/0545* (2013.01); *H01L 51/0018* (2013.01); *H01L 51/0541* (2013.01); *H01L 51/0562* (2013.01)

(58) Field of Classification Search
None
See application file for complete search history.

(56) References Cited

U.S. PATENT DOCUMENTS

| 2011/0140097 | A1 | 6/2011 | Cheong et al. |
| 2013/0075731 | A1* | 3/2013 | Han ................... H01L 29/66765 257/57 |
| 2015/0102333 | A1* | 4/2015 | Miyamoto .......... H01L 33/0041 257/40 |

FOREIGN PATENT DOCUMENTS

| CN | 102270604 A | 12/2011 |
| CN | 102637636 A | 8/2012 |
| CN | 102800629 A | 11/2012 |
| CN | 102983103 A | 3/2013 |
| CN | 103123911 A | 5/2013 |

(Continued)

OTHER PUBLICATIONS

First Office Action regarding Chinese application No. 201410784031.0, dated Oct. 9, 2016. Translation provided by Dragon Intellectual Property Law Firm.

*Primary Examiner* — Jack Chen
(74) *Attorney, Agent, or Firm* — Harness, Dickey & Pierce, P.L.C.

(57) ABSTRACT

The present disclosure provides a thin film transistor (TFT), its manufacturing method, an array substrate and a display device. The method for manufacturing the TFT includes steps of forming patterns of a gate electrode, a source electrode and a drain electrode on a base substrate; and forming a pattern of an active layer and a pattern of a passivation layer covering the active layer by a single patterning process. The passivation layer is made of a negative or positive photoresist, and the active layer is insulated from the gate electrode and electrically connected to the source electrode and the drain electrode.

10 Claims, 9 Drawing Sheets

(56) References Cited

FOREIGN PATENT DOCUMENTS

CN 103762246 A 4/2014
WO WO-2012-118713 A2 9/2012

* cited by examiner

THIN FILM TRANSISTOR, ITS MANUFACTURING METHOD, ARRAY SUBSTRATE AND DISPLAY DEVICE

CROSS-REFERENCE TO RELATED APPLICATION

The present application claims a priority of the Chinese patent application No. 201410784031.0 filed on Dec. 16, 2014, which is incorporated herein by reference in its entirety.

TECHNICAL FIELD

The present disclosure relates to the field of semiconductor technology, in particular to a thin film transistor (TFT), its manufacturing method, an array substrate and a display device.

BACKGROUND

An organic thin film transistor (OTFT) is a logic unit element with an organic semiconductor as an active layer, and it has such advantages as being suitable for massive production, being adapted to a flexible substrate and being of low production cost, so it has been widely used in flat-panel displays, sensors, memory cards and radio frequency identification (RFID) tags. Hence, the research and development of the OTFT has attached more and more attentions.

Currently, a patterning process of a traditional OTFT is usually achieved by ink-jet printing or photolithography. However, the ink-jet printing method can merely be used to meet a scenario where a low resolution is required, and a new printing device is required to achieve the massive production. Hence, it is more suitable to adopt photolithography, with lower production cost, as the patterning process to achieve the massive production of the OTFTs.

However, when the active layer of the OTFT is manufactured by photolithography, it is at first required to apply a photoresist layer onto the active layer. Next, the photoresist layer is directly exposed and developed so as to define an active layer pattern at the photoresist layer. Then, the active layer is etched by using the defined active layer pattern as a mask, so as to form the active layer pattern. Finally, the remaining photoresist at the active layer is removed, so as to form the active layer. During the manufacture of the active layer, the photoresist layer is in direct contact with the active layer, so the active layer will be damaged when removing the remaining photoresist on the active layer, thereby the performance of the OTFT will be adversely affected.

SUMMARY

An object of the present disclosure is to provide a TFT, its manufacturing method, an array substrate and a display device, so as to prevent an active layer from being damaged during the removal of a remaining photoresist layer from the active layer, thereby to prevent the performance of the TFT from being adversely affected.

In one aspect, the present disclosure provides in one embodiment a method for manufacturing a TFT, including a step of forming patterns of a gate electrode, a source electrode and a drain electrode on a base substrate. The method further includes a step of forming a pattern of an active layer and a pattern of a passivation layer covering the active layer by a single patterning process. The passivation layer is made of a negative or positive photoresist, and the active layer is insulated from the gate electrode and electrically connected to the source electrode and the drain electrode.

Alternatively, the step of forming the patterns of the active layer and the passivation layer covering the active layer by a single patterning process includes:
forming an active layer film on the base substrate;
forming a photoresist layer made of a positive or negative photoresist on the active layer film;
exposing and developing the photoresist layer so as to form the pattern of the passivation layer; and
etching the active layer film using the pattern of the passivation layer as a mask, so as to form the pattern of the active layer.

Alternatively, in order to prevent the occurrence of a large etching area and high power consumption during laser etching, the step of etching the active layer film includes dry-etching the active layer film with oxygen plasma.

Alternatively, in order to improve the performance of the TFT, subsequent to the step of forming the pattern of the passivation layer, the method further includes subjecting the base substrate with the passivation layer to high-temperature annealing treatment. An annealing temperature is a temperature desired for curing the positive or negative photoresist forming the passivation layer.

Alternatively, the photoresist layer is applied by spinning.

Alternatively, the passivation layer is of a thickness of 100 nm to 1000 nm.

Alternatively, the active layer is of a thickness of 10 nm to 100 nm.

Alternatively, the active layer is of a thickness of 40 nm to 60 nm.

Alternatively, the step of forming the patterns of the gate electrode, the source electrode, the drain electrode, the active layer and the passivation layer includes:
forming the pattern of the gate electrode on the base substrate;
forming on the base substrate with the gate electrode a gate insulating layer covering the gate electrode and the base substrate;
forming the patterns of the source electrode and the drain electrode on the gate insulating layer by a single patterning process; and
forming the patterns of the active layer and the passivation layer on the source electrode and the drain electrode by a single patterning process.

Alternatively, the step of forming the patterns of the gate electrode, the source electrode, the drain electrode, the active layer and the passivation layer on the base substrate includes:
forming the patterns of the source electrode and the drain electrode on the base substrate by a single patterning process;
forming the patterns of the active layer and the passivation layer on the source electrode and the drain electrode by a single patterning process;
forming the gate insulating layer covering the passivation layer on the base substrate; and
forming the pattern of the gate electrode on the gate insulating layer.

In another aspect, the present disclosure provides in one embodiment a TFT manufactured by the above-mentioned method, including a base substrate, a gate electrode arranged on the base substrate, an active layer insulated from the gate electrode, a source electrode and a drain electrode electrically connected to the active layer, and a passivation layer made of a negative or positive photoresist and covering the active layer.

In yet another aspect, the present disclosure provides in one embodiment an array substrate including the above-mentioned TFT.

In still yet another aspect, the present disclosure provides in one embodiment a display device including the above-mentioned array substrate.

According to the TFT, its manufacturing method, the array substrate and the display device in the embodiments of the present disclosure, the passivation layer is made of the negative or positive photoresist, so it is able to use the passivation layer as the photoresist for manufacturing the pattern of the active layer when forming the patterns of the active layer and the passivation layer covering the active layer by a single patterning process. In addition, after the patterning, it is not required to remove the remaining passivation layer on the active layer. As compared with the related art, it is able to prevent the active layer from being directly damaged due to the removal of the photoresist layer, thereby to ensure the performance of the TFT. Further, the remaining passivation layer may be used as a protection layer for the active layer, so it is able to prevent impurities from entering the active layer from above the active layer, thereby to further ensure the performance of the TFT.

BRIEF DESCRIPTION OF THE DRAWINGS

FIGS. 4a-4h are schematic views showing the TFT manufactured by the method according to the first embodiment of the present disclosure.

DETAILED DESCRIPTION

Figure 1:
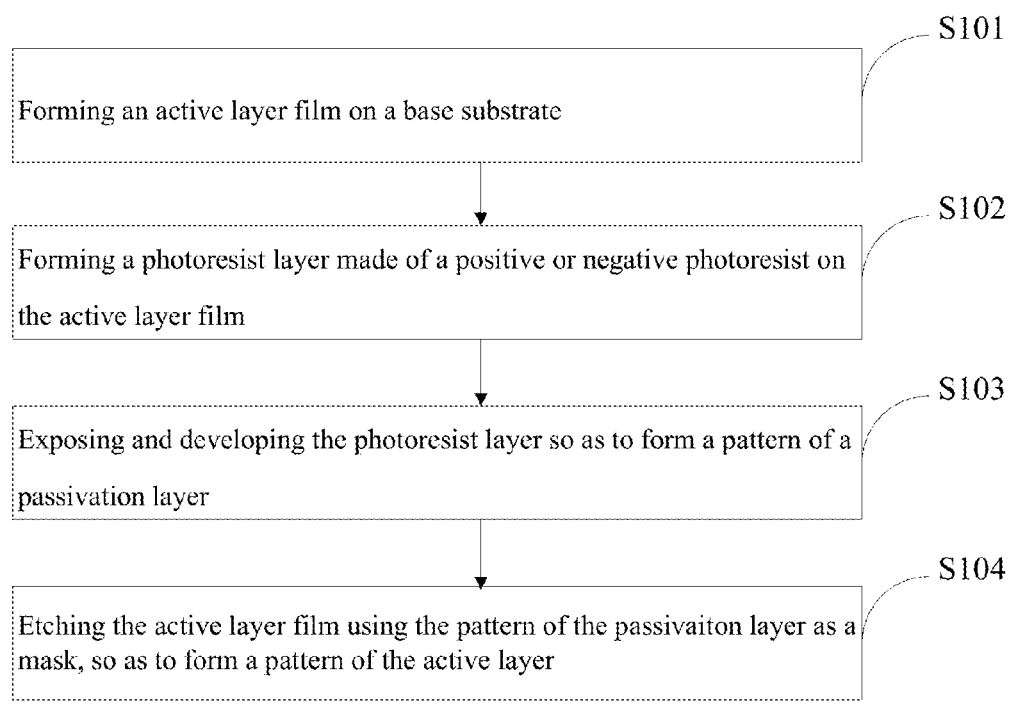
FIG. 1 is a flow chart of a step of forming a pattern of an active layer and a pattern of a passivation layer covering the active layer by a single patterning process according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure will be described hereinafter in conjunction with the drawings and embodiments. Shapes and sizes of respective layers in the drawings are for illustrative purposes only, but do not reflect an actual scale of a TFT, The present disclosure provides in one embodiment a method for manufacturing a TFT, including a step of forming patterns of a gate electrode, a source electrode and a drain electrode on a base substrate. The method further includes a step of forming a pattern of an active layer and a pattern of a passivation layer covering the active layer by a single patterning process. The passivation layer is made of a negative or positive photoresist, and the active layer is insulated from the gate electrode and electrically connected to the source electrode and the drain electrode.

According to the method in the embodiments of the present disclosure, the passivation layer is made of the negative or positive photoresist, so it is able to use the passivation layer as the photoresist for manufacturing the pattern of the active layer when forming the patterns of the active layer and the passivation layer covering the active layer by a single patterning process. In addition, after the patterning, it is not required to remove the remaining passivation layer on the active layer. As compared with the related art, it is able to prevent the active layer from being directly damaged due to the removal of the photoresist layer, thereby to ensure the performance of the TFT. Further, the remaining passivation layer may be used as a protection layer for the active layer, so it is able to prevent impurities from entering the active layer from above the active layer, thereby to further ensure the performance of the TFT.

Alternatively, as shown in FIG. 1, the step of forming the patterns of the active layer and the passivation layer covering the active layer by a single patterning process may include:

S101: forming an active layer film on the base substrate;
S102: forming a photoresist layer made of a positive or negative photoresist on the active layer film;
S103: exposing and developing the photoresist layer so as to form the pattern of the passivation layer; and
S104: etching the active layer film using the pattern of the passivation layer as a mask, so as to form the pattern of the active layer.

Further, upon the development of the photoresist layer, a developing solution may be a weak base or tetramethylammonium hydroxide (TMAH) with a concentration of 2.38%.

Alternatively, the step of etching the active layer film may include dry-etching the active layer film with oxygen plasma, so as to prevent the occurrence of a large etching area and high power consumption during laser etching.

Alternatively, in order to improve the performance of the TFT, subsequent to the step of forming the pattern of the passivation layer, the method may further include subjecting the base substrate with the passivation layer to high-temperature annealing treatment. An annealing temperature is a temperature desired for curing the positive or negative photoresist forming the passivation layer. Here, the high-temperature annealing treatment on the base substrate with the passivation layer is mainly used to rapidly remove a solvent in the passivation layer, thereby to cure the passivation layer and protect the active layer in a better manner. In addition, after the high-temperature annealing treatment, it is able to effectively reduce an off-state current of the TFT, thereby to remarkably increase a switch ratio of the TFT.

Alternatively, the passivation layer is of a thickness of 100 nm to 1000 nm.

Further, the active layer is made of an organic semiconductor material, e.g., an organic small-molecular polymer or an organic high-molecular polymer.

To be specific, during the implementation, the active layer may be of a thickness of 10 nm to 100 nm, and alternatively 40 nm to 60 nm.

It should be appreciated that, the above-mentioned method is adapted to the manufacture of a top-gate TFT or a bottom-gate TFT.

Figure 2:
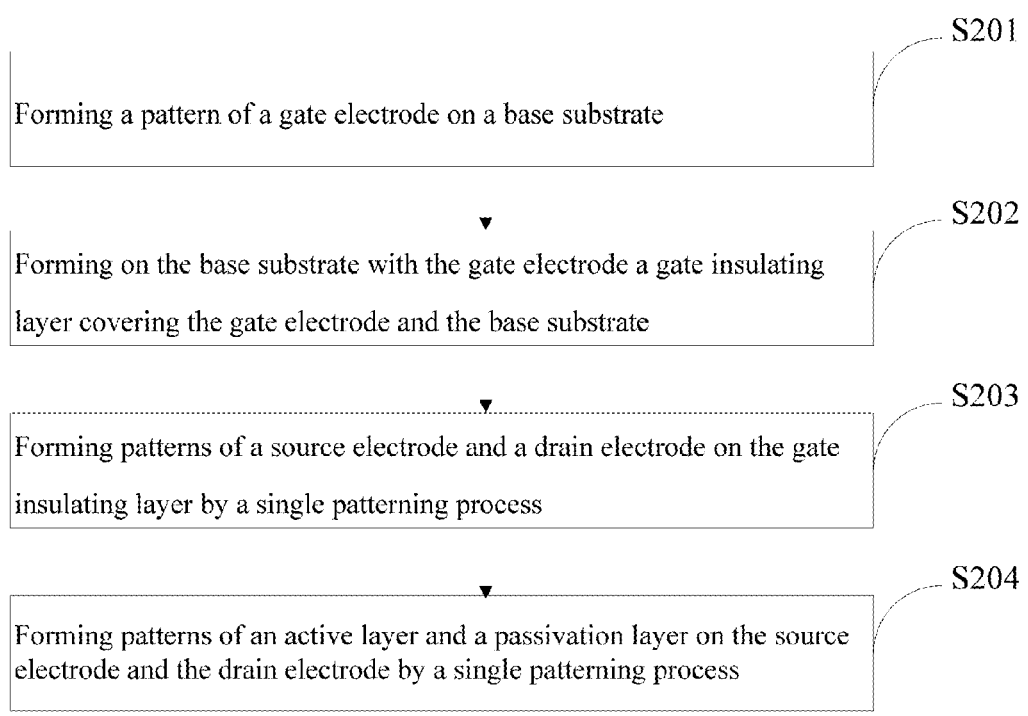
FIG. 2 is a flow chart of a method for manufacturing a bottom-gate TFT according to one embodiment of the present disclosure.

When the method is used for the manufacture of a bottom-gate TFT, as shown in FIG. 2, the step of forming the patterns of the gate electrode, the source electrode, the drain electrode, the active layer and the passivation layer may include:

S201: forming the pattern of the gate electrode on the base substrate;

S202: forming on the base substrate with the gate electrode a gate insulating layer covering the gate electrode and the base substrate;

S203: forming the patterns of the source electrode and the drain electrode on the gate insulating layer by a single patterning process; and S204: forming the patterns of the active layer and the passivation layer on the source electrode and the drain electrode by a single patterning process.

Figure 3:
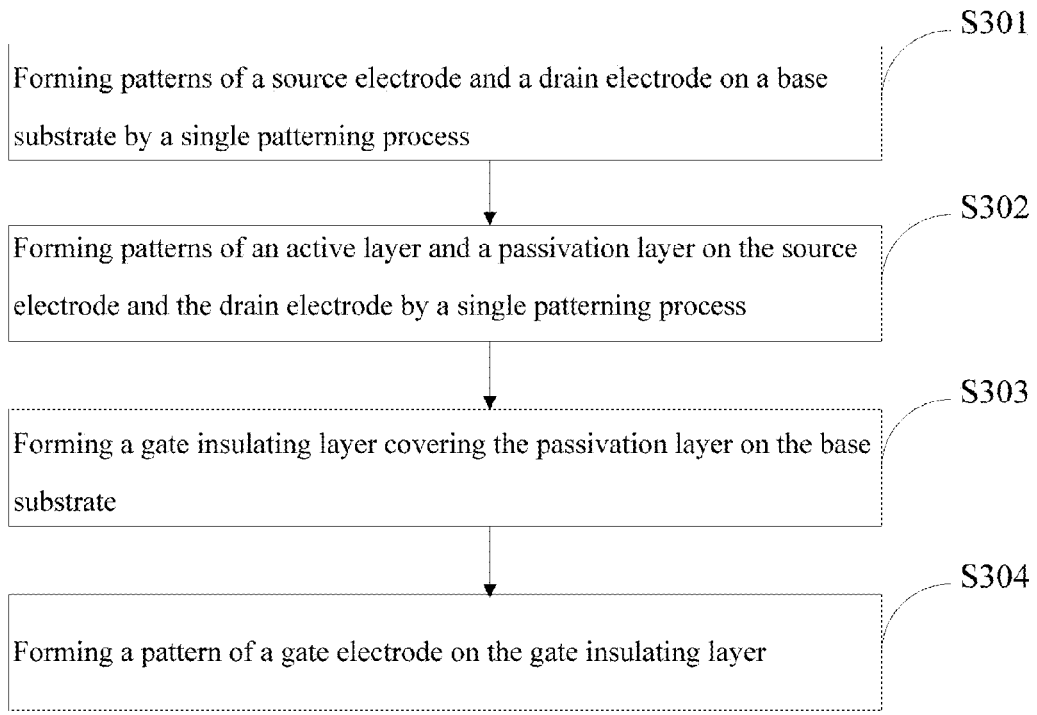
FIG. 3 is a flow chart of the method for manufacturing a top-gate TFT according to one embodiment of the present disclosure.

When the method is used for the manufacture of a top-gate TFT, as shown in FIG. 3, the step of forming the patterns of the gate electrode, the source electrode, the drain electrode, the active layer and the passivation layer on the base substrate may include:

S301: forming the patterns of the source electrode and the drain electrode on the base substrate by a single patterning process;

S302: forming the patterns of the active layer and the passivation layer on the source electrode and the drain electrode by a single patterning process;

S303: forming the gate insulating layer covering the passivation layer on the base substrate; and S304: forming the pattern of the gate electrode on the gate insulating layer.

To be specific, the gate electrode may be of a thickness of 20 nm to 200 nm, and made of metal, indium tin oxide (ITO), doped silicon or an organic conductive material.

To be specific, the gate insulating layer may be of a thickness of 100 nm to 500 nm, and made of SiOx, SiNx, a metal oxide, a metal nitride, or an organic material.

To be specific, the source electrode and the drain electrode formed at an identical layer may each be of a thickness of 20 nm to 300 nm, and made of metal, e.g., Au, Ag, Mo, Al or Cu, or ITO.

Further, the source and drain electrodes may each include a modification layer containing organic small molecules and/or self-assembled small molecules.

The method for manufacturing the TFT will be described hereinafter in conjunction with the following two embodiments.

First Embodiment

The method for manufacturing a bottom-gate TFT may include the following steps.

Figure 4A:
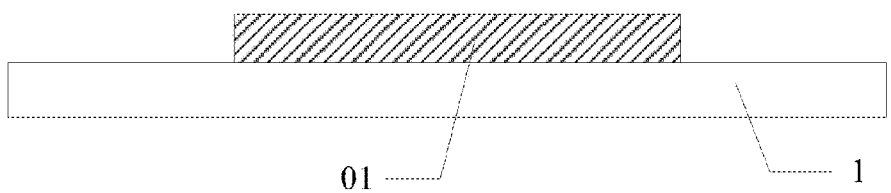

(1) Forming a pattern of a gate electrode 01 on a base substrate 1, as shown in FIG. 4a. To be specific, during the implementation, a gate electrode layer may be formed on the base substrate by thermal evaporation or sputtering, and then the pattern of the gate electrode may be formed by photolithography.

Figure 4B:
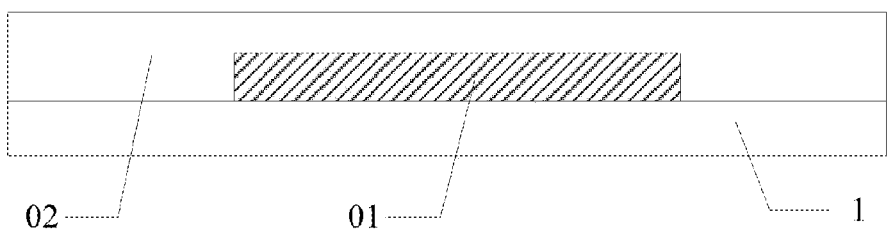

(2) Forming on the base substrate 1 with the gate electrode 01 a gate insulating layer 02 covering the gate electrode 01 and the base substrate 1, as shown in FIG. 4b. To be specific, during the implementation, the gate insulating layer may be formed by evaporation, sputtering or spinning.

Figure 4C:
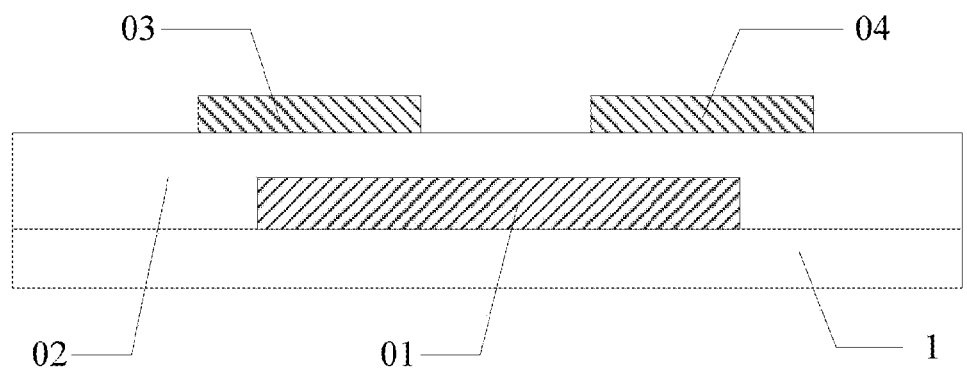

(3) Forming patterns of a source electrode 03 and a drain electrode 04 on the gate insulating layer 02 by a single patterning process, as shown in FIG. 4c. To be specific, during the implementation, a source/drain electrode layer may be formed on the gate insulating layer by evaporation, spinning or sputtering, and then the patterns of the source electrode and the drain electrode may be formed by photolithography.

Figure 4D:
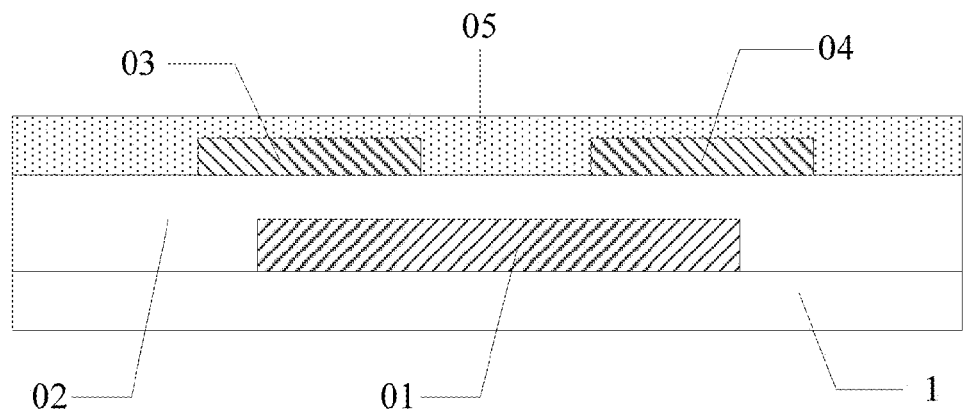
Figure 4C:
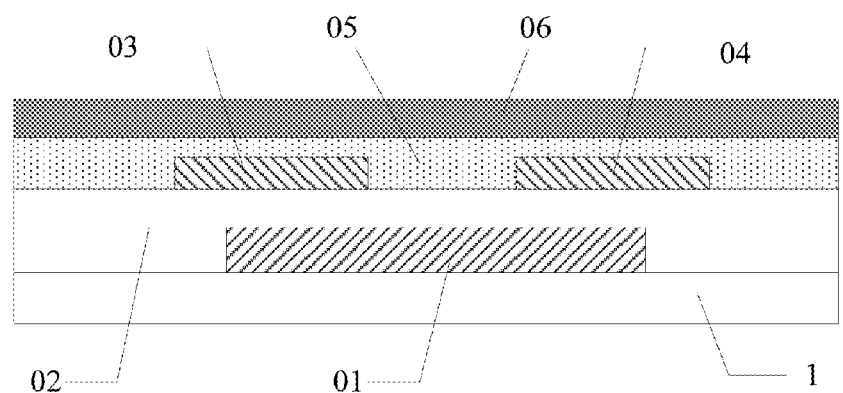

(4) Forming an active layer film 05 on the source electrode 03 and the drain electrode 04, as shown in FIG. 4d. To be specific, during the implementation, the active layer film may be formed by spinning.

(5) Forming a photoresist layer 06 made of a positive photoresist on the the active layer film 05, as shown in FIG. 4e. To be specific, during the implementation, the photoresist layer may be formed by spinning.

Figure 4F:
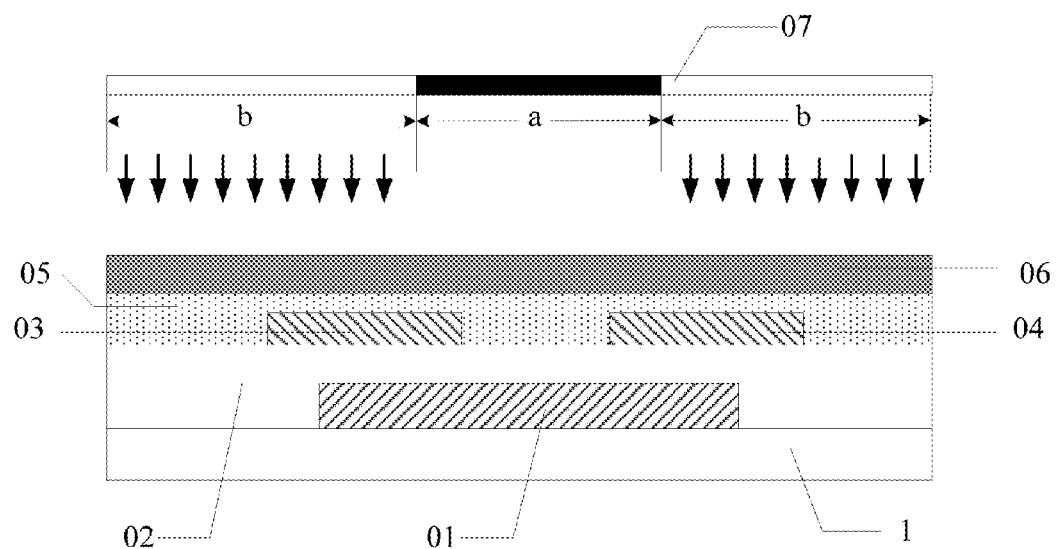

(6) Exposing the photoresist layer 06 with a positive mask plate 07, as shown in FIG. 4f. To be specific, during the implementation, a 365 nm i-ray exposure system may be used during the exposure.

Figure 4G:
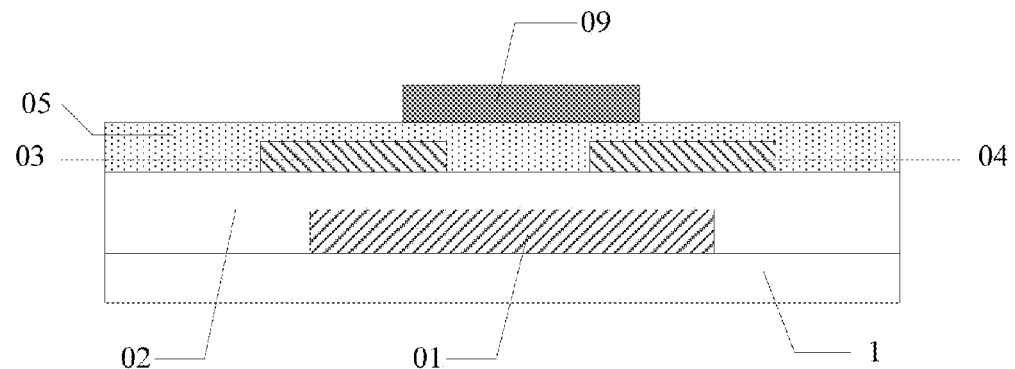

(7) Developing the exposed photoresist layer 06, so as to reserve an unexposed region a and remove an exposed region b of the photoresist layer 06, thereby to form a pattern of a passivation layer 09, as shown in FIG. 4g. To be specific, during the development, the base substrate may be immersed within TMAH with a concentration of 2.38% for about one minute, and then washed with pure water.

Figure 4H:
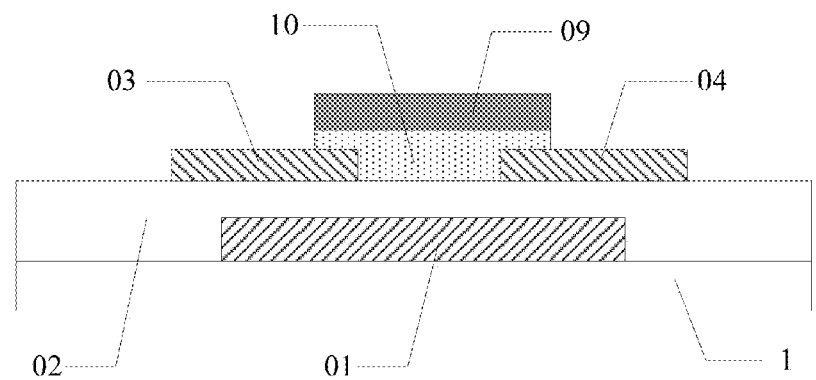

(8) Dry-etching the active layer film 05 with oxygen plasma using the pattern of the passivation layer 09 as a mask, so as to form a pattern of an active layer 10, as shown in FIG. 4h.

(9) Subjecting the above base substrate 1 to high-temperature annealing treatment, so as to cure the passivation layer 09.

Through the above steps (1) to (9), it is able to obtain the bottom-gate TFT.

Second Embodiment

The method for manufacturing a top-gate TFT may include the following steps.

Figure 5A:
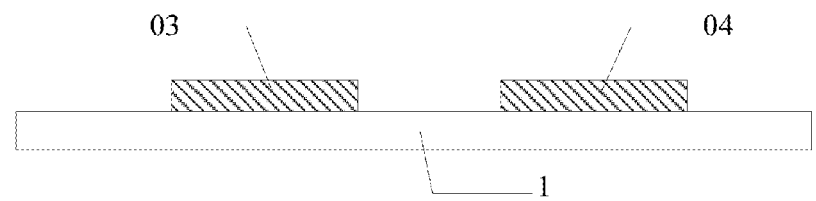
FIGS. 5a-5h are schematic views showing the TFT manufactured by the method according to the second embodiment of the present disclosure.

(1) Forming patterns of the source electrode 03 and the drain electrode 04 on the base substrate 1 by a single patterning process, as shown in FIG. 5a. To be specific, during the implementation, a source/drain electrode layer may be formed on the base substrate by evaporation, spinning or sputtering, and then the patterns of the source electrode and the drain electrode may be formed by photolithography.

Figure 5B:
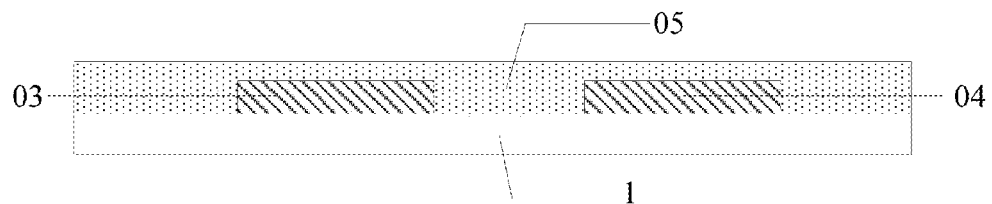

(2) Forming the active layer film 05 on the source electrode 03 and the drain electrode 04, as shown in FIG. 5b. To be specific, during the implementation, the active layer film may be formed by spinning.

Figure 5C:
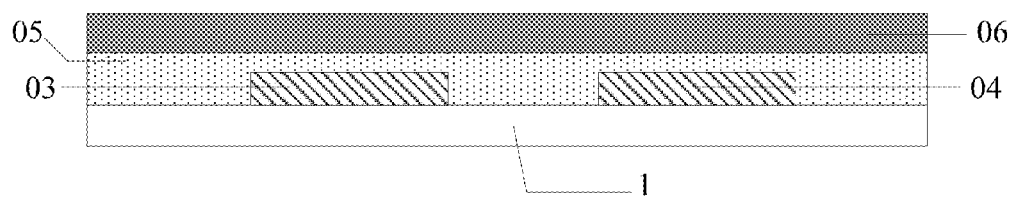

(3) Forming the photoresist layer 06 made of a negative photoresist on the active layer film 05, as shown in FIG. 5c. To be specific, during the implementation, the photoresist layer may be formed by spinning.

Figure 5D:
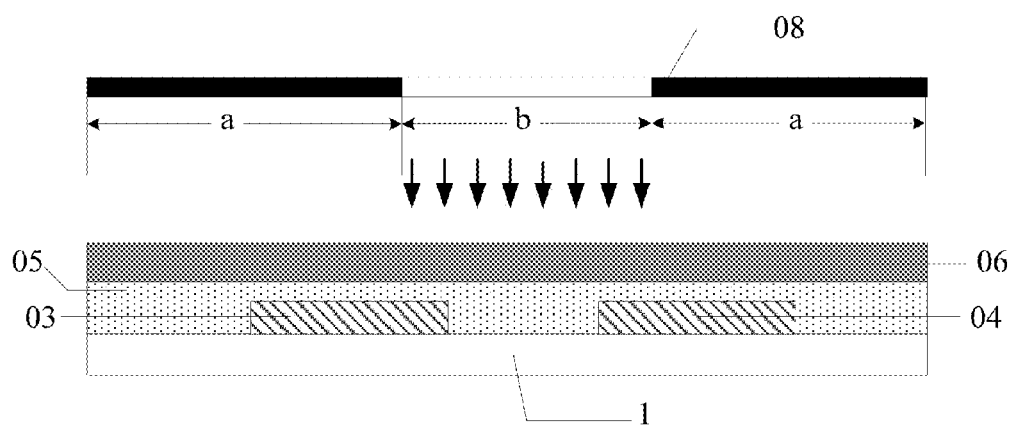

(4) Exposing the photoresist layer 06 with a negative mask plate 08, as shown in FIG. 5d. To be specific, a 365 nm i-ray exposure system may be used during the exposure.

Figure 5E:
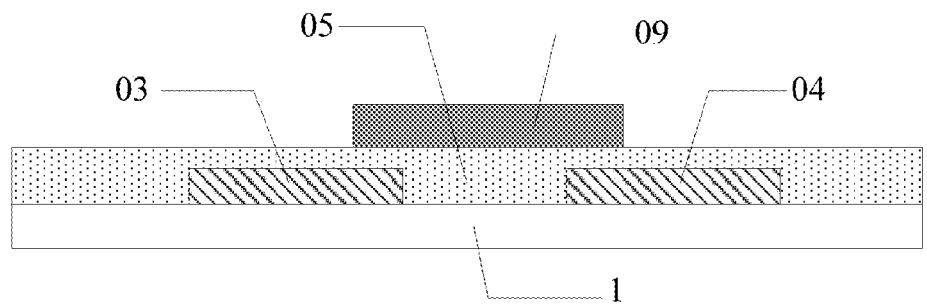

(5) Developing the exposed photoresist layer 06, so as to reserve an exposed region b and remove an unexposed region a at the photoresist layer 06, thereby to form a pattern of the passivation layer 09 at the photoresist layer 06, as shown in FIG. 5e. To be specific, during the development, the base substrate may be immersed in TMAH with a concentration of 2.38% for about one minute, and then washed with pure water.

Figure 5F:
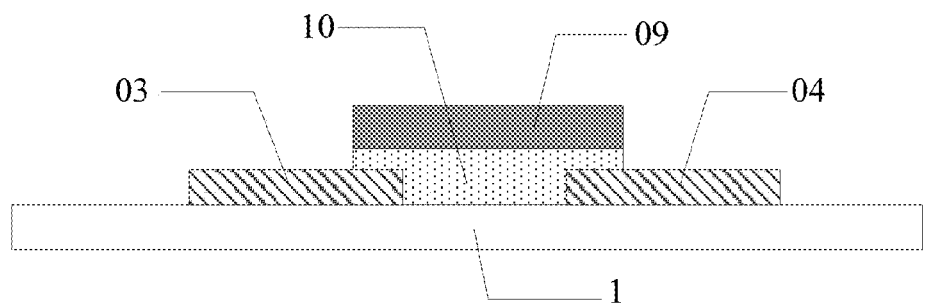

(6) Dry-etching the active layer film 05 with oxygen plasma using the pattern of the passivation layer 09 as a mask, so as to form a pattern of the active layer 10, as shown in FIG. 5f.

(7) Subjecting the base substrate 1 to high-temperature annealing treatment, so as to cure the passivation layer 09.

Figure 5G:
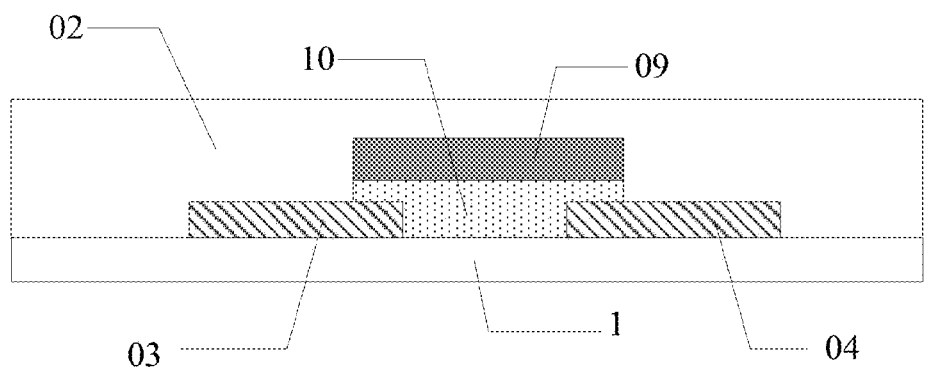

(8) Forming the gate insulating layer 02 covering the passivation layer 09 on the base substrate 1, as shown in FIG. 5g. To be specific, during the implementation, the gate insulating layer may be formed by evaporation, sputtering or spinning.

Figure 5H:
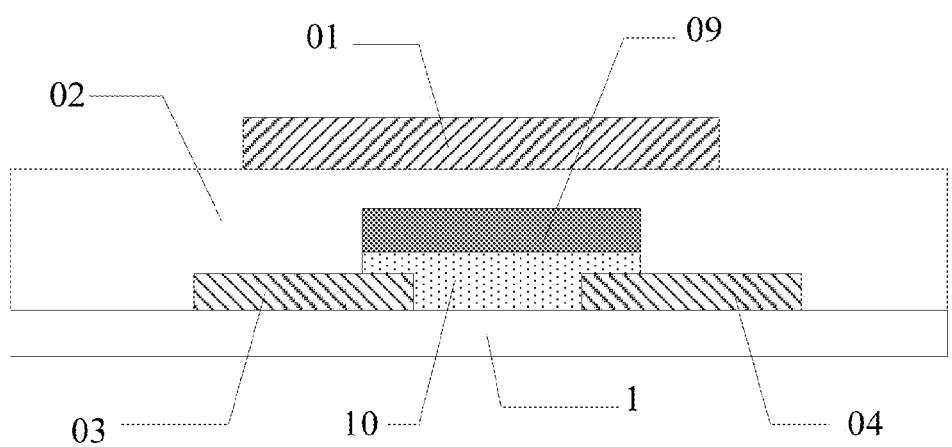

(9) Forming a pattern of the gate electrode 01 on the gate insulating layer 02, as shown in FIG. 5h. To be specific, during the implementation, a gate electrode layer may be formed on the base substrate by thermal evaporation or sputtering, and then the pattern of the gate electrode may be formed by photolithography.

Through the above-mentioned steps (1) to (9), it is able to obtain the top-gate TFT.

Based on an identical inventive concept, the present disclosure provides in one embodiment a TFT manufactured by the above-mentioned method, which, as shown in FIGS. 4h and 5h, includes the base substrate 1, the gate electrode 01 arranged on the base substrate 1, the active layer 10 insulated from the gate electrode 01, the source electrode 03 and the drain electrode 04 electrically connected to the active layer 10, and the passivation layer 09 made of a negative or positive photoresist and covering the active layer 10.

According to the TFT in the embodiments of the present disclosure, the passivation layer is made of the negative or positive photoresist, so it is able to use the passivation layer as the photoresist for manufacturing the pattern of the active layer when forming the patterns of the active layer and the passivation layer covering the active layer by a single patterning process. In addition, after the patterning, it is not required to remove the remaining passivation layer on the active layer. As compared with the related art, it is able to prevent the active layer from being directly damaged due to the removal of the photoresist layer, thereby to ensure the performance of the TFT. Further, the remaining passivation layer may be used as a protection layer for the active layer, so it is able to prevent impurities from entering the active layer from above the active layer, thereby to further ensure the performance of the TFT.

Based on an identical inventive concept, the present disclosure provides in one embodiment an array substrate which includes the above-mentioned TFT. The other indispensable components of the array substrate are known in the art. The implementation of the array substrate may refer to the above embodiments about the TFT, and thus will not be repeated herein.

To be specific, the array substrate may be applied to a liquid crystal display (LCD) panel, or an organic light-emitting diode (OLED) display panel.

Based on an identical inventive concept, the present disclosure provides in one embodiment a display device, which includes the above-mentioned array substrate. The display device may be any product or member having a display function, such as a mobile phone, a flat-panel PC, a TV, a display, a laptop PC, a digital photo frame or a navigator. The other indispensable components of the display device are known in the art. The implementation of the display device may refer to the above embodiment about the array substrate, and thus will not be repeated herein.

According to the TFT, its manufacturing method, the array substrate and the display device in the embodiments of the present disclosure, the passivation layer is made of the negative or positive photoresist, so it is able to use the passivation layer as the photoresist for manufacturing the pattern of the active layer when forming the patterns of the active layer and the passivation layer covering the active layer by a single patterning process. In addition, after the patterning, it is not required to remove the remaining passivation layer on the active layer. As compared with the related art, it is able to prevent the active layer from being directly damaged due to the removal of the photoresist layer, thereby to ensure the performance of the TFT. Further, the remaining passivation layer may be used as a protection layer for the active layer, so it is able to prevent impurities from entering the active layer from above the active layer, thereby to further ensure the performance of the TFT.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A method for manufacturing a thin film transistor (TFT), comprising steps of:
   forming patterns of a gate electrode, a source electrode and a drain electrode on a base substrate; and
   forming a pattern of an active layer and a pattern of a passivation layer covering the active layer by a single patterning process,
   wherein the passivation layer is made of a negative or positive photoresist, and the active layer is insulated from the gate electrode and electrically connected to the source electrode and the drain electrode,
   wherein the step of forming the patterns of the active layer and the passivation layer covering the active layer by a single patterning process comprises:
   forming an active layer film on the base substrate;
   forming a photoresist layer made of the negative or the positive photoresist on the active layer film;
   exposing and developing the photoresist layer so as to form the pattern of the passivation layer; and
   etching the active layer film using the pattern of the passivation layer as a mask, so as to form the pattern of the active layer,
   wherein after forming the pattern of the passivation layer, the base substrate with the passivation layer is subjected to a high-temperature annealing treatment, and
   wherein an annealing temperature is a temperature that cures the negative or the positive photoresist that forms the passivation layer.

2. The method according to claim 1, wherein the step of etching the active layer film comprises:
   dry-etching the active layer film with oxygen plasma.

3. The method according to claim 1, wherein the photoresist layer is applied by spinning.

4. The method according to claim 1, wherein the passivation layer is of a thickness of 100 nm to 1000 nm.

5. The method according to claim 1, wherein the active layer is of a thickness of 10 nm to 100 nm.

6. The method according to claim 5, wherein the active layer is of a thickness of 40 nm to 60 nm.

7. The method according to claim 1, wherein the step of forming the patterns of the gate electrode, the source electrode, the drain electrode, the active layer and the passivation layer comprises:
 forming the pattern of the gate electrode on the base substrate;
 forming on the base substrate with the gate electrode a gate insulating layer covering the gate electrode and the base substrate;
 forming the patterns of the source electrode and the drain electrode on the gate insulating layer by a single patterning process; and
 forming the patterns of the active layer and the passivation layer on the source electrode and the drain electrode by a single patterning process.

8. The method according to claim 2, wherein the step of forming the patterns of the gate electrode, the source electrode, the drain electrode, the active layer and the passivation layer comprises:
 forming the pattern of the gate electrode on the base substrate;
 forming on the base substrate with the gate electrode a gate insulating layer covering the gate electrode and the base substrate;
 forming the patterns of the source electrode and the drain electrode on the gate insulating layer by a single patterning process; and
 forming the patterns of the active layer and the passivation layer on the source electrode and the drain electrode by a single patterning process.

9. The method according to claim 1, wherein the step of forming the patterns of the gate electrode, the source electrode, the drain electrode, the active layer and the passivation layer on the base substrate comprises:
 forming the patterns of the source electrode and the drain electrode on the base substrate by a single patterning process;
 forming the patterns of the active layer and the passivation layer on the source electrode and the drain electrode by a single patterning process;
 forming the gate insulating layer covering the passivation layer on the base substrate; and
 forming the pattern of the gate electrode on the gate insulating layer.

10. The method according to claim 2, wherein the step of forming the patterns of the gate electrode, the source electrode, the drain electrode, the active layer and the passivation layer on the base substrate comprises:
 forming the patterns of the source electrode and the drain electrode on the base substrate by a single patterning process;
 forming the patterns of the active layer and the passivation layer on the source electrode and the drain electrode by a single patterning process;
 forming the gate insulating layer covering the passivation layer on the base substrate; and
 forming the pattern of the gate electrode on the gate insulating layer.

* * * * *